United States Patent [19]

Moll et al.

[11] Patent Number: 4,718,042
[45] Date of Patent: Jan. 5, 1988

[54] NON-DESTRUCTIVE METHOD AND CIRCUIT TO DETERMINE THE PROGRAMMABILITY OF A ONE TIME PROGRAMMABLE DEVICE

[75] Inventors: Maurice M. Moll; Daniel L. Ellsworth, both of Fort Collins, Colo.

[73] Assignee: NCR Corporation, Dayton, Ohio

[21] Appl. No.: 811,983

[22] Filed: Dec. 23, 1985

[51] Int. Cl.$^4$ .................... G11C 29/00; G11C 17/00
[52] U.S. Cl. ........................... 365/201; 365/96; 371/21
[58] Field of Search .............. 365/201, 96, 104, 94, 365/103; 371/21

[56] References Cited

U.S. PATENT DOCUMENTS

| | | | |
|---|---|---|---|
| 4,272,833 | 6/1981 | Taylor | 365/201 |
| 4,418,403 | 11/1983 | O'Toole et al. | 365/201 |
| 4,459,694 | 7/1984 | Veno et al. | 365/201 |
| 4,488,262 | 12/1984 | Basire et al. | 365/104 |
| 4,638,243 | 1/1987 | Chan | 371/21 |

Primary Examiner—Stuart N. Hecker
Assistant Examiner—Glenn A. Gossage
Attorney, Agent, or Firm—Wilbert Hawk, Jr.; Casimer K. Salys; Floyd A. Gonzalez

[57] ABSTRACT

In a one time programmable memory device having a memory cell, a programmable device in the memory cell having a high initial resistance, a user readable circuit for reading the condition of the programmable device, and capacitance coupled with the initial resistance and having an RC time constant therewith, a circuit and its method for non-destructively testing the programmability of the programmable device. A switch device is included in the user readable circuit and is connected to the capacitance. The switch device has a first condition for discharging the capacitance and a second condition for allowing the capacitance to charge through the programmable device. An output circuit in the user readable circuit indicates when the charge on the capacitance reaches a predetermined threshold. A test enabling element is responsive to a test enable signal for selectively changing the switch device between its second condition and its first condition to conduct a test for measuring the RC time constant, thereby testing the programmability of the programmable device.

7 Claims, 3 Drawing Figures

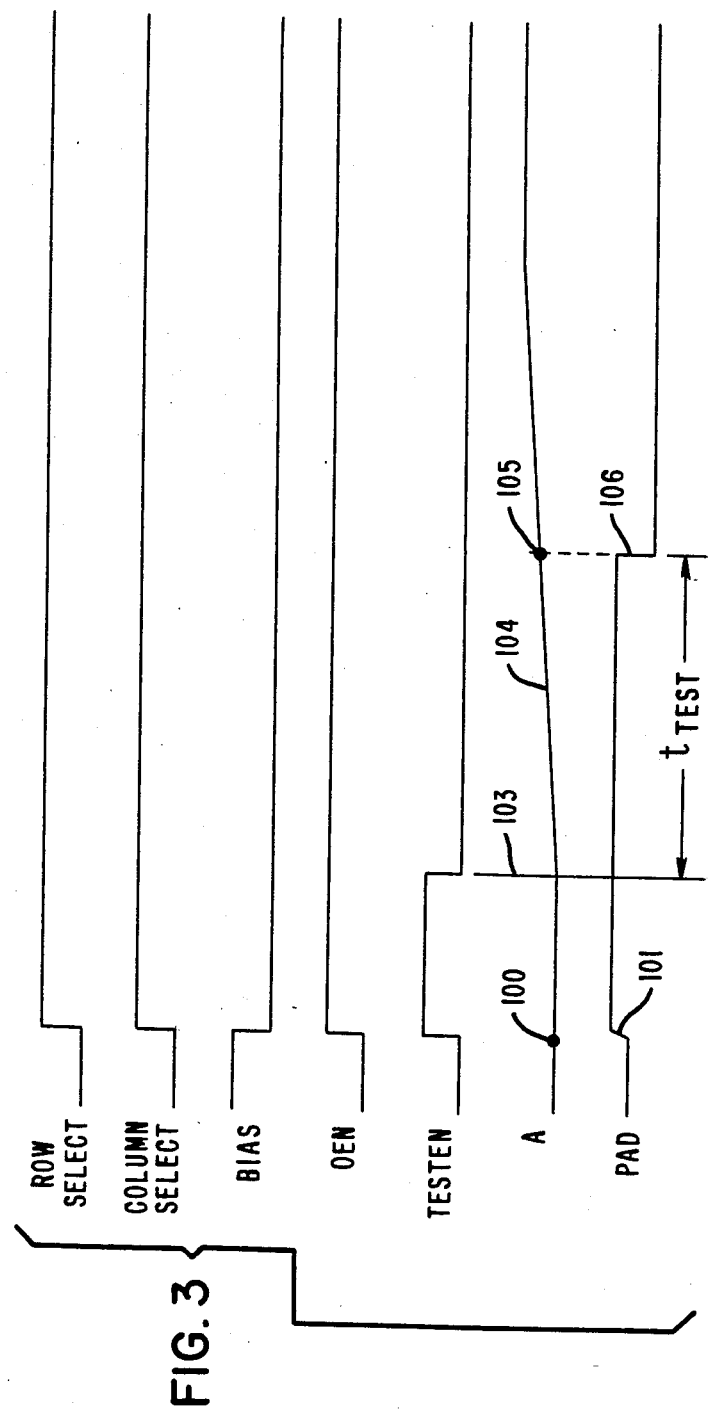

NON-DESTRUCTIVE METHOD AND CIRCUIT TO DETERMINE THE PROGRAMMABILITY OF A ONE TIME PROGRAMMABLE DEVICE

BACKGROUND OF THE INVENTION

The present invention is related to one time programmable devices, and is more particularly related to a non-destructive method and its circuit for use in determining the programmability of a one time programmable device.

One time programmable devices containing a plurality of memory cells or bits in a memory array, and in which each bit may be individually programmed by a user, are well known. One important consideration in the design of one time programmable devices is the probability of future programming of such devices. The best way to test programmability of these devices is to actually program each memory cell. However, this renders the devices useless. Any test procedure which measures parameters known to correlate statistically with future bit programmability can dramatically impact final programming yield and customer satisfaction with the product. For instance, it has been found that if the individual bit programmability of a sample of 64K devices can be improved from 99.999% to 99.9999% (an improvement of $9 \times 10^{-4}\%$) the resultant increase in programming yield will be over 41%.

U.S. Pat. No. 4,488,262 by Basire et al., issued Dec. 11, 1984 for "Electronically Programmable Read Only Memory," discloses a one time programmable read only memory device wherein each memory cell is formed of a bipolar transistor provided with a base region and an emitter region covered with a dielectric layer. When the cell is in its initial condition it represents a binary 0 information bit. The application of approximately 4 volts causes the dielectric layer to break down, and places the bit line in ohmic contact with the emitter, which sets the cell in its second condition representing a binary 1 information bit.

U.S. Pat. No. 4,418,403 by O'Toole et al., issued Nov. 29, 1983 for "Semiconductor Memory Cell Margin Test Circuit," discloses a semiconductor memory cell test circuit for testing the operating margin of semiconductor memory cells without affecting the operation of the peripheral circuits which read or write the memory cell being tested.

U.S. Pat. No. 4,459,694 by Ueno et al., issued July 10, 1984 for "Field Programmable Device With Circuitry For Detecting Poor Insulation Between Adjacent Word Lines," discloses a circuit for testing for poor insulation between word lines in a field programmable memory device.

SUMMARY OF THE INVENTION

Included in a one time programmable memory device is a memory cell, a programmable device in the memory cell having a high initial resistance, a user readable circuit for reading the condition of the programmable device, and capacitance coupled with the initial resistance and having an RC time constant therewith. A circuit and its method for nondestructively testing the programmability of the programmable device is disclosed which includes a switch device in the user readable circuit and connected to the capacitance. The switch device has a first condition for discharging the capacitance, and a second condition for allowing the capacitance to charge through the programmable device. An output circuit in the user readable circuit indicates when the charge on the capacitance reaches a predetermined threshold. A test enabling element is responsive to a test enable signal for selectively charging the switch device between its second condition and its first condition to conduct a test for measuring the RC time constant, thereby testing the programmability of the programmable means.

An object of the present invention is to provide a circuit which allows for the non-destructive testing of the probability to program a one time programmable device.

Another object of the present invention is to provide a method for the non-destructive testing of the probability to program a one time programmable device.

These and other objects of the present invention will become apparent from the drawings and the preferred embodiment disclosed herein.

BRIEF DESCRIPTION OF THE DRAWINGS

FIG. 3, when taken together, is a timing diagram of various signals for conducting a test using the circuit of FIG. 1.

DESCRIPTION OF THE PREFERRED EMBODIMENT

Figure 1:
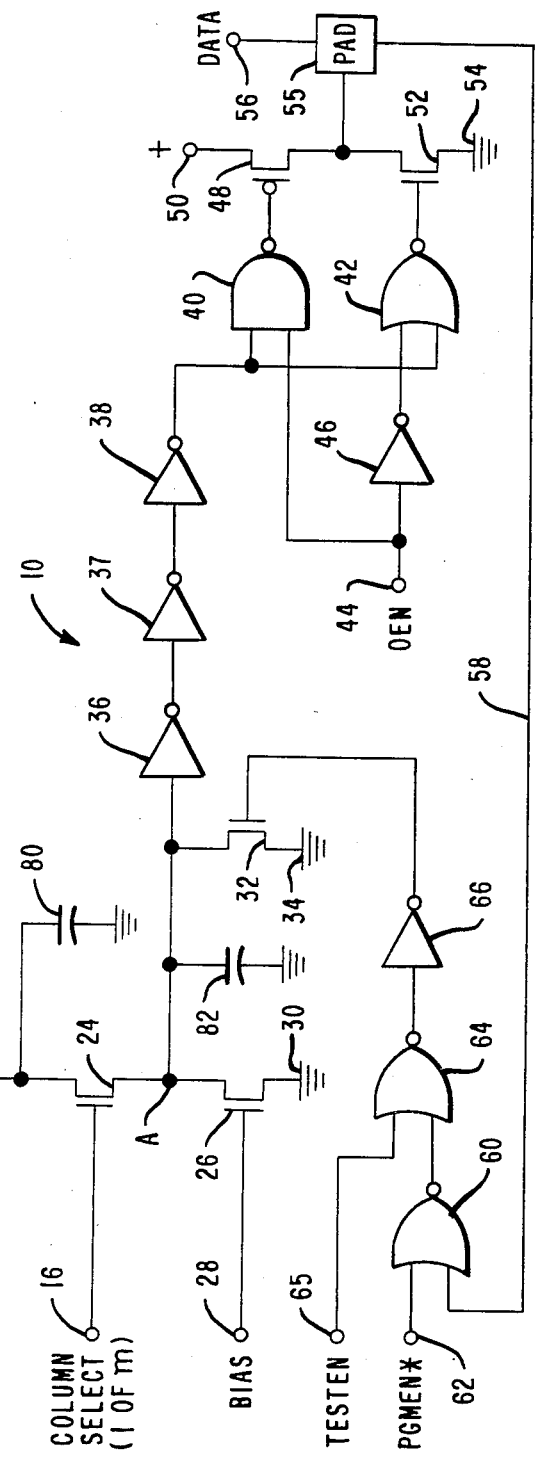
FIG. 1 is a schematic diagram of a sense amplifier including the present invention and one of a plurality of memory cells of a one time programmable device.
Figure 1:
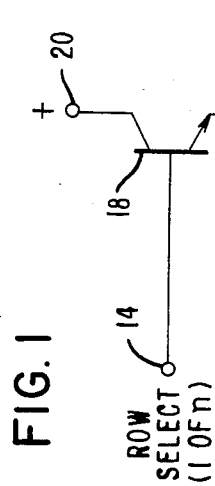

FIG. 1 is a schematic diagram showing a sense amplifier 10, including the present invention, and one memory cell 12 of a plurality of memory cells of a one time programmable device. The memory cell 12 includes a row select terminal 14 for receiving one of n ROW SELECT signals for selecting a row of memory cells. A column select terminal 16 is included in a select section (not shown) for receiving one of m COLUMN SELECT signals for selecting a column of memory cells. Thus, in a well understood manner, a particular memory cell 12 may be selected by enabling a ROW SELECT signal and a COLUMN select signal, where the selected memory cell 12 is the memory cell at the intersection of the selected row and the selected column.

The memory cell 12 includes an npn transistor 18 having a collector connected to a source voltage terminal 20, its base connected to the row select terminal 14, and its emitter connected to one end of an antifuse device 22. The other end of the anti-fuse device 22 is connected to the drain of a field effect transistor (FET) 24, whose gate is connected to the column select terminal 16. The source of the FET 24 is connected to the drain of an FET 26, whose gate is connected to a bias terminal 28 for receiving a BIAS signal, and whose source is grounded at 30.

The sense amplifier 10 includes a node A between the source of FET 24 and the drain of FET 26. Node A is connected to the drain of FET 32, whose source is grounded at 34. Node A is also connected to the input of inverter 36, which is in turn connected in series with inverters 37 and 38. The output of the inverter 38 is connected to one input of a NAND gate 40, and one input of a NOR gate 42. An output enable terminal 44 is provided for receiving an output enable (OEN) signal, to be discussed. The output enable terminal 44 is connected to a second input of the NAND gate 40, and is connected to the input of an inverter 46 whose output is connected to a second input of the NOR gate 42. The output of the NAND gate 40 is connected to the gate of a p channel output driver transistor 48 whose source is connected to a voltage source terminal 50. The drain of the p channel output driver transistor 48 is connected to the drain of an n channel output driver transistor 52 whose gate is connected to the output of inverter 42. The source of the n channel output driver transistor is grounded at 54. A pad 55 is connected to the drains of the p channel output driver transistor 48 and the n channel output driver transistor 52. A data signal (DATA) is received at a data input terminal 56 which is connected to pad 55.

It will be understood that when the OEN signal on terminal 44 is in an enable high condition, the NAND gate 40 and the NOR gate 42 will be enabled. If, while the OEN signal is high, the output of the inverter 38 is high, a low will be placed on the gate of the p channel output driver transistor 48, turning on transistor 48 and placing a high on the pad 55. If, however, the output of the inverter 38 is low, a high will be placed on the gate of the n channel output driver transistor 52, turning on transistor 52 and placing a low on the pad 55. When the OEN signal at 44 is low, the NAND gate 40 and the NOR gate 42 are disabled, allowing the DATA signal at 56 to be placed on the pad 55. A feedback conductor 58 is connected to the pad 55 and to one input of a NOR gate 60. A second input of the NOR gate 60 is connected to a program enable terminal 62 for receiving a program enable (PGMEN*) signal which is enabled when in its low condition. The output of the NOR gate 60 is connected to one input of NOR gate 64, whose other input is connected to a test enable terminal 65 for receiving a test enable (TESTEN) signal. The output of the NOR gate 64 is connected to the input of an inverter 66, whose output is connected to the gate of FET 32.

Figure 2:
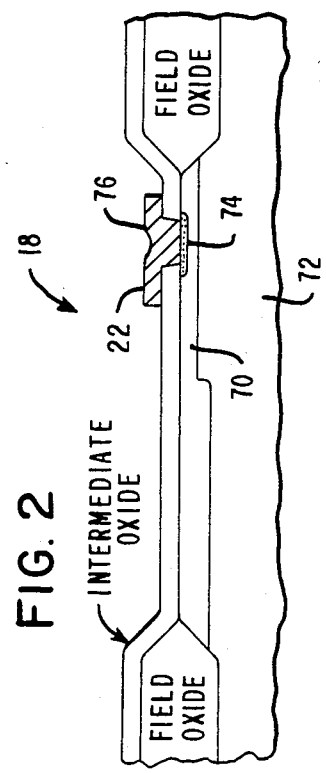
FIG. 2 is a fractional cross sectional view of a merged structure of an npn transistor and an anti-fuse device of the memory cell of FIG. 1.

The transistor 18 and anti-fuse device 22 may be merged into a single structure, as is known. The merged structure is shown in FIG. 2 wherein the base of the transistor 18 is formed of a region 70 of a p type material between an n-type substrate 72 which forms the collector of the transistor 18, and a region 74 of n+ type material which forms the emitter of the transistor 18 of FIG. 1. The anti-fuse device 22 is formed of polysilicon 76 which is formed in contact with the n+ region 74. The polysilicon 76 is intrinsic, and has a heavily arsenic doped surface, resulting in an initial emitter resistance of from one to ten Megohms. To program the memory cell 12, it is selected by energizing its respective ROW SELECT signal at 14 and its respective COLUMN SELECT signal at 16. The FET 32 is then turned on to cause a high emitter current to flow through the anti-fuse device 22. Under high emitter current of sufficient duration, the polysilicon 76 of FIG. 2 undergoes an irreversible structural change which causes the creation of a low resistance filament through the polysilicon 76, thus providing a low resistance connection between the emitter of the transistor 18 and the drain of the FET 24 (see FIG. 1).

Once the memory cell 12 is selected, the anti-fuse device 22 is programmed as follows. The BIAS signal at 28 is disabled low, and the OEN signal at 44 is disabled low. The low OEN signal at 44 disables the NAND gate 40 and the NOR gate 42, turning off the p channel output driver transistor 48 and the n channel output driver transistor 52, respectively. Turning off the output driver transistors 48 and 52, which together act as a tri-state device, allows a binary DATA signal to be placed on the pad 55 and the feedback conductor 58 via data terminal 56. The PGMEN* signal at 62 is then enabled low. If the DATA signal at 56 is high, the output of the NOR gate 60 (with the PGMEN* signal at 62 low) will be low. With the TESTEN signal at 65 low, the NOR gate 64 will act as an inverter, inverting the low from the NOR gate 60 to a high. This high will be inverted by inverter 66 to a low, holding the FET 32 in its off condition. Thus, when the PGMEN* signal at 62 is low and the DATA signal at 56 is high, the anti-fuse device 22 will be left intact, programming the selected memory cell 12 to its high or 1 condition.

If the PGMEN* signal is low and the DATA signal at 56 is low, the output of the NOR gate 60 goes high to be inverted by the NOR gate 64 to a low (assuming the TESTEN signal at 65 is low). The low on the output of the NOR gate 64 is inverted to a high by the inverter 66, turning on the FET 32. The FET 32 is a large transistor having a relatively low turned-on resistance, thus causing a large emitter current to flow through anti-fuse device 22. The FET 32 is held on in this case by the PGMEN* signal for a sufficient length of time to blow the anti-fuse device and program the selected memory cell 12 to its low or 0 condition, as previously described.

It will be understood that, after programming, the condition of the memory cell 12 may be read by enabling the ROW SELECT signal at 14, the COLUMN SELECT signal at 16, the BIAS signal at 28, and the OEN signal at 44. If these signals are enabled and the anti-fuse device 22 is intact, its high resistance will cause the voltage on node A to be near ground potential when the BIAS signal at 28 turns on the FET 26. This low on node A will be transmitted as a high to the NAND gate 40, thereby turning on the p channel output driver transistor 48 to be read as a logic 1 on pad 55. If the anti-fuse device 22 is not intact, its resultant low resistance will cause the turned-on resistance of the FET 26 to act as a voltage divider, placing a high on node A. This high on node A will be transmitted to the NOR gate 42 as a low, turning on the n channel output driver transistor 52 to be read as a logic 0 on pad 55.

The present circuit includes the NOR gate 64, as previously discussed, for providing a testing function to test the probability that the memory cell 12 will program as desired, while keeping the anti-fuse device 22 intact. The memory cell 12 and its connected lines include inherent capacitance which together are shown in FIG. 1 as a capacitor 80. Also, the peripheral circuits of the sense amplifier 10 include inherent capacitance which together are shown in FIG. 1 as capacitor 82. The initial high resistance of the anti-fuse device 22, together with the capacitors 80 and 82 form an RC circuit whose time constant can be determined by the circuit of FIG. 1.

To measure the RC time constant for a selected memory cell, the respective ROW SELECT signal at 14 and COLUMN SELECT signal at 16 are enabled to select a desired memory cell 12 to be tested from the memory cell array. At the same time, the BIAS signal at 28 is disabled, and the OEN signal at 44 and the TESTEN signal at 65 are enabled (see FIG. 3). The high TESTEN signal at 65 causes the output of the NOR gate 64 to go low, which low is inverted by inverter 66 to a high, turning on FET 32 which acts as a switch. The turning on of FET 32 causes a low on node A (see 100 of FIG. 3). This low on node A appears as a high on NAND gate 40, which turns on the p channel output driver transistor 48, causing a high to appear on pad 55 (see 101 of FIG. 3).

The TESTEN signal at 65 is then kept enabled for a sufficient length of time to discharge capacitors 80 and 82, but not long enough to blow anti-fuse device 22 as previously described. The TESTEN signal at 65 is then disabled (see 103 of FIG. 3). When the TESTEN signal is disabled, the capacitors 80 and 82 begin to charge through the high resistance of the still intact anti-fuse device 22. As the capacitors 80 and 82 are charged, the voltage on node A increases (see 104 of FIG. 3). When the voltage on node A increases to the trip-point of the inverter 36 (see 105 of FIG. 3), the output of the inverter 36 goes low, which is transmitted as a low to NOR gate 42, turning on the n channel output driver transistor 52. This causes the voltage on the pad 55 to go low (see 106 of FIG. 3).

The time between the disabling of the TESTEN signal at 103 and the fall of the pad voltage at 106 (shown in FIG. 3 as $t_{test}$) is a direct measure of the RC time constant of the initial value of the resistance of the anti-fuse device 22 and the capacitors 80 and 82. The time $t_{test}$ is thus a good indicator as to the probability of whether or not the memory cell 12 will program. For instance, if the anti-fuse device 22 is not intact, such as by an internal short or other defect, the time $t_{test}$ will be much shorter than normal. Other types of defects which might prevent the anti-fuse device 22 from being programmed properly, such as the improper forming of its arsenic doped surface as discussed in connection with FIG. 2, may result in a time $t_{test}$ which is much longer than normal. A probability to properly program table may be determined by subjecting a sample of memory devices including the circuit of FIG. 1 to the described test, and recording the resultant time $t_{test}$ for each memory cell tested. The sample may then be programmed, and the previously measured time noted for any cell which fails to program properly. In this way, a range of times for cells having a high probability to be programmed may be determined.

Thus, a circuit has been described which provided the aforementioned objects. It will be understood by those skilled in the art that the disclosed embodiment is exemplary only, and that the various elements disclosed may be replaced by equivalents without departing from the invention hereof, which equivalents are intended to be covered by the appended claims.

What is claimed is:

1. In a one time programmable memory device having a memory cell which includes an inherent capacitance, programmable means in the memory cell having a high initial resistance which is coupled with the inherent capacitance and has an RC time constant therewith, and user readable means for reading the condition of the programmable means, a circuit for non-destructively testing the programmability of the programmable means comprising:

switch means in the user readable means and connected to the inherent capacitance of said memory cell, said switch means having a first condition for discharging said inherent capacitance and a second condition for allowing said inherent capacitance to charge through said programmable means;

output means in the user readable means for indicating when the charge on the inherent capacitance reaches a predetermined threshold;

test enabling means responsive to a test enable signal for selectively changing said switch means between its second condition and its first condition to conduct a test for measuring the RC time constant, thereby testing the programmability of the programmable means.

2. The circuit of claim 1 further comprising an inverter in said user readable means having its input connected for receiving the voltage on said inherent capacitance such that said predetermined threshold is established.

3. The circuit of claim 1, wherein said output means includes a pad having an output voltage responsive to the output voltage of said inverter, a feedback means connecting said pad to said switch means, and wherein said test enabling means is a logic device in said feedback means having one input for receiving said test enable signal and a second input for receiving the voltage on said pad.

4. The circuit of claim 3, wherein said logic device is a NOR gate.

5. The circuit of claim 3, wherein said switch means is a field effect transistor having its source grounded, its drain connected to the input of said inverter, and its gate connected to said feedback means for receiving the output of said logic device.

6. In a one time programmable memory device having a memory cell which includes an inherent capacitance, programmable means in the memory cell having a high initial resistance which is connected to said inherent capacitance and has an RC time constant therewith, and user readable means for reading the condition of the programmable means, a method for non-destructively testing the programmability of the programmable means comprising the steps of:

providing a switch means having a first condition for discharging the inherent capacitance, and a second condition for allowing the inherent capacitance to charge through the initial resistance of the programmable means;

providing output means in the user readable means for indicating when the charge on the inherent capacitance reaches a predetermined threshold;

selectively placing said switch means in its first condition for discharging the inherent capacitance;

subsequently placing said switch means in its second condition for allowing the inherent capacitance to charge through the initial resistance of the programmable means; and measuring the time between placing said switch means in its second condition and said indication from said output means that the charge on the inherent capacitance has reached said predetermined threshold.

7. The method of claim 6 further comprising:

comparing the measured time of the measuring step to standard known times for determining the probability that said programmable means will program properly.

* * * * *